(12) United States Patent
Schachter

(10) Patent No.: US 8,878,056 B2
(45) Date of Patent: Nov. 4, 2014

(54) SOLAR ENERGY CONVERSION DEVICE AND METHOD

(75) Inventor: Levi Schachter, Haifa (IL)

(73) Assignee: Techinion Research and Development Foundation Ltd., Haifa (IL)

( * ) Notice: Subject to any disclaimer, the term of this patent is extended or adjusted under 35 U.S.C. 154(b) by 622 days.

(21) Appl. No.: 12/837,346

(22) Filed: Jul. 15, 2010

(65) Prior Publication Data

US 2010/0276000 A1 Nov. 4, 2010

Related U.S. Application Data

(63) Continuation-in-part of application No. PCT/IL2009/000068, filed on Jan. 18, 2009.

(51) Int. Cl.
*H01L 31/052* (2014.01)
*H02N 3/00* (2006.01)

(52) U.S. Cl.
CPC ............... *H02N 3/00* (2013.01); *H01L 31/052* (2013.01); *Y02E 10/52* (2013.01)
USPC ........... 136/259; 136/252; 310/301; 310/302; 310/305; 310/306; 310/310

(58) Field of Classification Search
CPC ......... H01L 31/052; H02N 3/00; Y02E 10/52
USPC .......... 136/252, 259; 310/301, 302, 305, 306, 310/308, 310
See application file for complete search history.

(56) References Cited

U.S. PATENT DOCUMENTS 3,054,914 A * 9/1962 Hatsopoulos et al. ........ 310/306
3,278,768 A 10/1966 Bernstein (Continued)

FOREIGN PATENT DOCUMENTS

DE 102006014574 A1 10/2007
FR 2876232 A1 4/2006
WO WO2008011877 A2 1/2008

OTHER PUBLICATIONS

Samer Banna, Valery Berezovsky, and Levi Schächter, "Experimental Observation of Direct Particle Acceleration by Stimulated Emission of Radiation", Physical Review Letters, Sep. 28, 2006, pp. 1-4, Article PRL 97, 134801 (2006), The American Physical Society, USA.

(Continued)

*Primary Examiner* — Matthew Martin
(74) *Attorney, Agent, or Firm* — Marc Van Dyke; 4th Dimension IP

(57) ABSTRACT

A device and method for producing electricity by harnessing sunlight to produce an amplified voltage signal, the device including: (a) a sealed chamber, defined by a transparent housing; (b) an excitable medium, disposed within the chamber, in which, when the medium is exposed to solar light having wavelengths in a range of 0.2 to 3 micrometers, bound electrons in the excitable medium are elevated to at least one higher energy state; (c) electrodes, disposed in a spaced apart fashion, whereby the medium is between, and fluidly communicates with, the electrodes; (d) an electric circuit, the medium and the electrodes completing the circuit; (e) an initiating mechanism, adapted to initiate an initial voltage signal through the chamber, between the electrodes, and (f) a power source, associated with the circuit, and adapted to maintain the first voltage signal through the chamber, between the electrodes, whereby the bound electrons in the higher energy state transfer energy to free electrons traversing the first voltage signal to produce the amplified voltage signal, and wherein the excitable medium is selected, and adapted within the chamber, to absorb at least 5% of an energy flux within a wavelength range of 0.2 to 3 micrometers, emitted by a black body operating at 5500K, by elevating the bound electrons to the higher energy state.

20 Claims, 5 Drawing Sheets

(56) References Cited

U.S. PATENT DOCUMENTS

| | | | |
|---|---|---|---|
| 3,299,299 A | | 1/1967 | Dickinson |
| 3,508,089 A | * | 4/1970 | Cheshire ................ 310/306 |
| 6,713,668 B2 | * | 3/2004 | Akamatsu ................ 136/205 |
| 6,720,704 B1 | * | 4/2004 | Tavkhelidze et al. ........ 310/306 |
| 2003/0111104 A1 | | 6/2003 | Akamatsu |

OTHER PUBLICATIONS

Samer Banna, Valery Berezovsky, and Levi Schächter, "Particle acceleration by stimulated emission of radiation: Theory and experiment", Physical Review, Oct. 23, 2006, pp. 1-14, Article E 74, 046501 (2006), The American Physical Society, USA.

International Preliminary Report on Patentability Chapter I for WO/2009/090652—Aug. 3, 2010.

International Search Report for WO/2009/090652—Aug. 3, 2010.

Written Opinion of the International Search Authority for WO/2009/090652—Aug. 3, 2010.

Machine Translation of DE102006014574—Oct. 4, 2007.

Machine Translation of FR2876232—Jul. 4, 2006.

Machine Translation of WO2008011877—Jan. 31, 2008.

* cited by examiner

SOLAR ENERGY CONVERSION DEVICE AND METHOD

CROSS-REFERENCE TO RELATED APPLICATIONS

This patent application is a continuation-in-part of PCT/IL2009/000068 filed on Jan. 18, 2009 and published as WO/2009/090652, and claims priority to U.S. Provisional Patent Application 61/021,478 filed on Jan. 16, 2008, which are all hereby incorporated in their entirety by reference.

FIELD AND BACKGROUND OF THE INVENTION

The present invention relates to the harnessing of solar light, and, more particularly, to a device and method for producing electricity by amplifying a voltage using solar light.

More energy from sunlight strikes the Earth in one hour ($4.3 \times 10^{20}$ J) than all the energy consumed on the planet in a year ($4.1 \times 10^{20}$ J). Although, as of 2001, solar electricity was a $7.5 billion industry growing at a rate of 35-40% per annum, solar electricity provided less than 0.1% of the world's electricity. The huge gap between the present use of solar energy and the enormous undeveloped potential thereof defines a major challenge in energy research. Covering 0.16% of the land on Earth with 10% efficient solar conversion systems would provide 20 TW of power, nearly twice the world's consumption rate of fossil energy.

However, the cost per watt of delivered electricity produced from solar light, for example, by means of photovoltaic cells, needs to be significantly reduced, to economically compete with primary fossil energy.

A state-of-the art report of the Basic Energy Sciences Workshop on Solar Energy Utilization ("Basic Research Needs for Solar Energy Utilization", U.S. Department of Energy, Apr. 18-21, 2005; http://www.sc.doe.gov/bes/reports/files/SEU_rpt.pdf) provides an overview of key scientific challenges and research directions that may enable efficient and economic use of the solar resource to provide a significant fraction of global primary energy by the mid 21st century.

These research directions notwithstanding, it is believed that there is room and need for additional directions, and further improvements, in the harnessing of solar energy to produce electricity, and the subject matter of the present disclosure and claims is aimed at fulfilling this need.

SUMMARY OF THE INVENTION

According to the teachings of the present invention there is provided a device for producing electricity by harnessing sunlight to produce an amplified voltage signal, with respect to a first voltage signal, the device including: (a) a sealed chamber, at least partially defined by an at least partially transparent housing; (b) at least one excitable medium, disposed within the chamber, in which, when the medium is exposed to solar light having wavelengths in a range of 0.2 micrometers to 3 micrometers, bound electrons in the excitable medium are elevated to at least one discretely higher energy state; (c) at least two electrodes, disposed in a spaced apart fashion, and disposed with respect to a wall of the chamber whereby at least a portion of the medium is between, and fluidly communicating with, the electrodes; (d) an electric circuit, the portion of the medium and the electrodes completing the circuit; (e) an initiating mechanism, adapted to initiate an initial voltage signal through the chamber, between the electrodes; (f) a power source, associated with the circuit, and adapted to maintain the first voltage signal through the chamber, between the electrodes, whereby the bound electrons in the higher energy state transfer energy to free electrons traversing the first voltage signal to produce the amplified voltage signal, and wherein the excitable medium is selected, and adapted within the chamber, to absorb at least 5% of an energy flux within a wavelength range of 0.2 micrometers to 3 micrometers, emitted by a black body operating at 5500K, by elevating the bound electrons to the higher energy state.

According to another aspect of the present invention there is provided a device for producing solar electricity by harnessing sunlight to produce an amplified voltage signal, with respect to a first voltage signal, the device including: (a) a sealed chamber, at least partially defined by an at least partially transparent housing; (b) at least one excitable medium, disposed within the chamber, in which, when the medium is exposed to solar light having a wavelength in a range of 0.2 micrometers to 3 micrometers, bound electrons in the excitable medium are elevated to at least one higher energy state; (c) an optical concentrator, optically disposed between a solar light source and the chamber, the concentrator adapted to concentrate light from the source, and to direct the light through the housing into the excitable medium; (d) at least two electrodes, disposed in a spaced apart fashion, and disposed with respect to a wall of the chamber whereby at least a portion of the medium is between, and fluidly communicating with, the electrodes; (e) an electric circuit, the portion of the medium and the electrodes completing the circuit; (f) an initiating mechanism, adapted to initiate an initial voltage signal through the chamber, between the electrodes; (g) a power source, associated with the circuit, and adapted to maintain the first voltage signal through the chamber, between the electrodes, whereby the bound electrons in the higher energy state transfer energy to free electrons traversing the first voltage signal to produce the amplified voltage signal.

According to yet another aspect of the present invention there is provided a device for producing solar electricity by harnessing sunlight to produce an amplified voltage signal, with respect to a first voltage signal, the device including: (a) a sealed chamber, at least partially defined by an at least partially transparent housing; (b) at least one excitable medium, disposed within the chamber, in which, when the medium is exposed to solar light having wavelengths in a range of 0.2 micrometers to 3 micrometers, bound electrons in the excitable medium are elevated to at least one higher energy state; (c) at least two electrodes, disposed in a spaced apart fashion, and disposed with respect to a wall of the chamber whereby at least a portion of the medium is between, and fluidly communicating with, the electrodes; (d) an electric circuit, the portion of the medium and the electrodes completing the circuit; (e) an initiating mechanism, adapted to initiate an initial voltage signal through the chamber, between the electrodes; (f) a power source, associated with the circuit, and adapted to maintain the first voltage signal through the chamber, between the electrodes, whereby the bound electrons in the higher energy state transfer energy to free electrons flowing in the first voltage signal to produce the amplified voltage signal, and wherein the sealed chamber has a superatmospheric pressure.

According to yet another aspect of the present invention there is provided a method of producing solar electricity by harnessing solar light to produce an amplified voltage signal, the method including: (a) providing the device; (b) exposing the excitable medium to the solar light; (c) producing the first voltage signal by means of the mechanism, and (d) amplifying the first voltage signal by the transfer of the energy of the electrons to the free electrons, to produce the amplified voltage signal.

According to further features in the described preferred embodiments, the device further includes an optical concentrator, optically disposed between a solar light source and the chamber, the concentrator adapted to concentrate light from the solar light source.

According to still further features in the described preferred embodiments, the excitable medium includes at least one excitable gas.

According to still further features in the described preferred embodiments, the sealed chamber has a superatmospheric pressure, preferably above 1.2 atmospheres absolute (ATA), above 2 ATA, above 4 ATA, or above 8 ATA.

According to still further features in the described preferred embodiments, the at least partially transparent housing includes a solid wall, preferably including a glass or a sintered, substantially transparent ceramic material.

According to still further features in the described preferred embodiments, the excitable gas is selected from the group of gases consisting of neon, argon, xenon, and sulfur hexafluoride, and having a partial vapor fraction of at least 0.02, within the chamber.

According to still further features in the described preferred embodiments, the excitable gas includes less than 0.01, by partial vapor fraction, water vapor.

According to still further features in the described preferred embodiments, the excitable gas includes less than 0.01, by partial vapor fraction, mercury vapor.

According to still further features in the described preferred embodiments, the excitable gas includes less than 0.01, by partial vapor fraction, oxygen.

According to still further features in the described preferred embodiments, the excitable medium is selected and adapted within the chamber to absorb at least 10%, preferably at least 25%, more preferably at least 45%, yet more preferably at least 60%, and most preferably at least 70%, of the energy flux, by elevating the bound electrons to the higher energy state.

According to still further features in the described preferred embodiments, the mean transition time of the bound electrons from the higher energy state to a lower energy state is at least 1 nanosecond.

According to still further features in the described preferred embodiments, the power source is a current source.

According to still further features in the described preferred embodiments, the device further includes a collector, electrically connected to the circuit, and adapted to remove, from the device, energy gained by the free electrons.

According to still further features in the described preferred embodiments, the excitable gas includes a mixture of excitable gases, typically at least 4 gases, or at least 5 to 20 gases, each having a partial vapor fraction of at least 0.02, within the chamber.

According to still further features in the described preferred embodiments, the excitable gas or gases is selected from the group of gases consisting of neon, argon, xenon, and sulfur hexafluoride, and having a partial vapor fraction of at least 0.02, within the chamber.

According to still further features in the described preferred embodiments, the optical concentrator is a parabolic concentrator.

According to still further features in the described preferred embodiments, the optical concentrator has an optical surface area, wherein a ratio of the optical surface area to an optical surface area of the chamber is at least 2 to 1, more preferably, at least 5 to 1, yet more preferably, at least 50 to 1, and most preferably, at least 500 to 1.

According to still further features in the described preferred embodiments, the method further includes the step of collecting the energy in an output disposed outside of the chamber.

According to still further features in the described preferred embodiments, the an operating temperature of the excitable medium within the chamber is above 325K, above 400K, or above 500K.

According to still further features in the described preferred embodiments, the ratio of a voltage of the amplified signal to the first signal is at least 1.01, at least 1.1, at least 3, or at least 10.

According to still further features in the described preferred embodiments, the first signal has a voltage in a range of 0.5 Volts to 1000 Volts, and more typically, 1 Volt to 500 Volts.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. Throughout the drawings, like-referenced characters are used to designate like elements.

In the drawings.

DESCRIPTION OF THE PREFERRED EMBODIMENTS

Figure 1A:
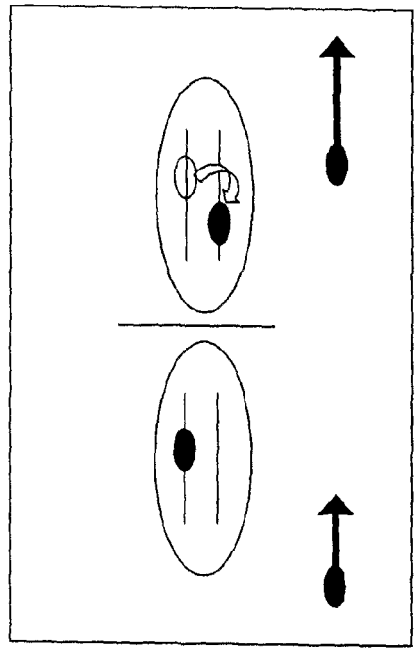
FIGS. 1a-1d schematically show various prior-art physics experiments pertaining to the discrete energies associated with the energy states of an electron, and the interactions of these electrons with one or more incoming photons or electrons.

The principles and operation of the apparatus and method according to the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The instant invention utilizes specific interactions between free electrons and bound electrons to harness solar energy and produce electricity therefrom. Interactions between free electrons and bound electrons have been studied extensively since the early 20$^{th}$ century. Some of the first experimental evidence of quantum mechanics was provided by Frank and Hertz, who in 1914 demonstrated that a free electron moving in the vicinity of a mercury atom transfers part of its kinetic energy to a bound electron in discrete amounts, causing the latter to jump from a lower to a higher energy-state—as illustrated schematically in FIG. 1(a). Based on fundamental quantum mechanical arguments, it then became clear that the opposite process is possible.

Figure 1B:
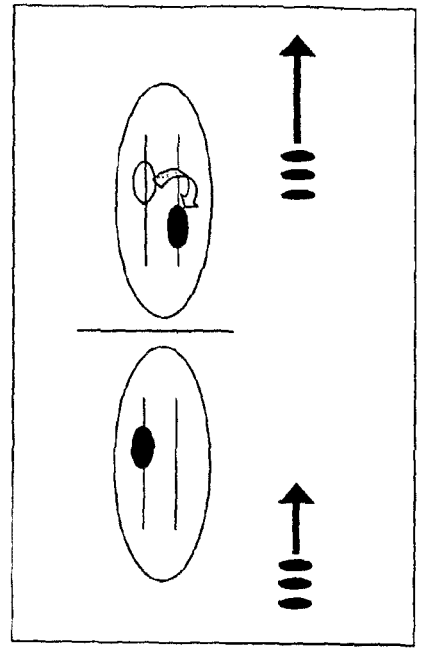

In 1930, Latyscheff and Leipunsky demonstrated the feasibility of the inverse process. Relying on the fact that stimulated absorption of radiation is manifested by a transition of the atom's outer electron from a low energy-state to an upper energy-state, mercury vapor was illuminated with light from a mercury lamp. Latyscheff and Leipunsky demonstrated that when a free electron is injected into the mercury vapors, under, subatmospheric pressure the free electron may gain energy in quanta corresponding to the energy stored in the mercury atoms. In this process, known as a "collision of the second kind", the outer electron in the excited atom drops to the lower energy-state, and delivers the energy to the free electron; FIG. 1(b) schematically illustrates this process. Both the Frank and Hertz experiment and the Latyscheff and Leipunsky experiment were designed for a single encounter of a free electron with a mercury atom and naturally, the electron's energy gain (or loss) of the electron was of the order of a few electron-volts.

Figure 1C:
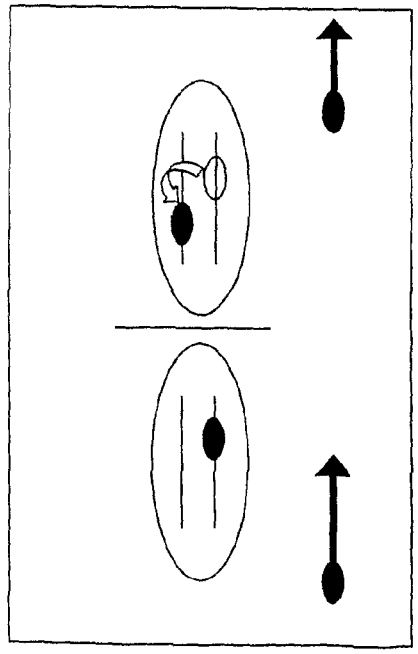

In 1958, Schawlow and Townes demonstrated the feasibility of utilizing energy stored in atoms for multiple collisions. In this experiment, photons were used instead of the free electrons that had been used both by Frank and Hertz and by Latyscheff and Leipunsky. FIG. 1(c) schematically illustrates this process.

Figure 1D:
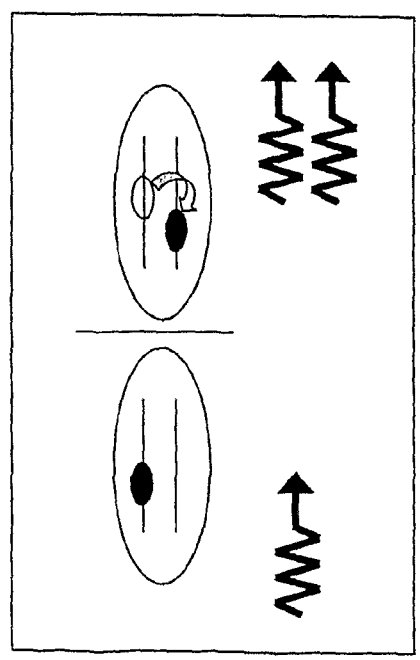

S. Banna, et al. ["Experimental Observation of Direct Particle Acceleration by Stimulated Emission of Radiation", Physical Review Letters, 97, 134801 (2006); "Particle Acceleration by Stimulated Emission of Radiation: Theory and Experiment", Physical Review E, 74, 046501 (2006)] recently demonstrated that a relativistic, ultra-high energy (45 MeV) beam of electrons can be accelerated by energy stored in molecules via collisions of the second kind, under a subatmospheric pressure of about 0.25 atmospheres. This process is schematically illustrated in FIG. 1(d).

To date, collisions of the second kind have been studied as a conceptual, theoretical topic in quantum mechanics, and, in conjunction with advanced particle accelerators, as a means for unveiling the secrets of the Universe.

I have discovered, however, that collisions of the second kind may be advantageously utilized to simply and inexpensively produce electricity from solar light. The inventive method and device, presented herein, may obviate the need for photovoltaic cell technology, which, today, is the predominant technology for producing electricity from solar light.

Figure 2:
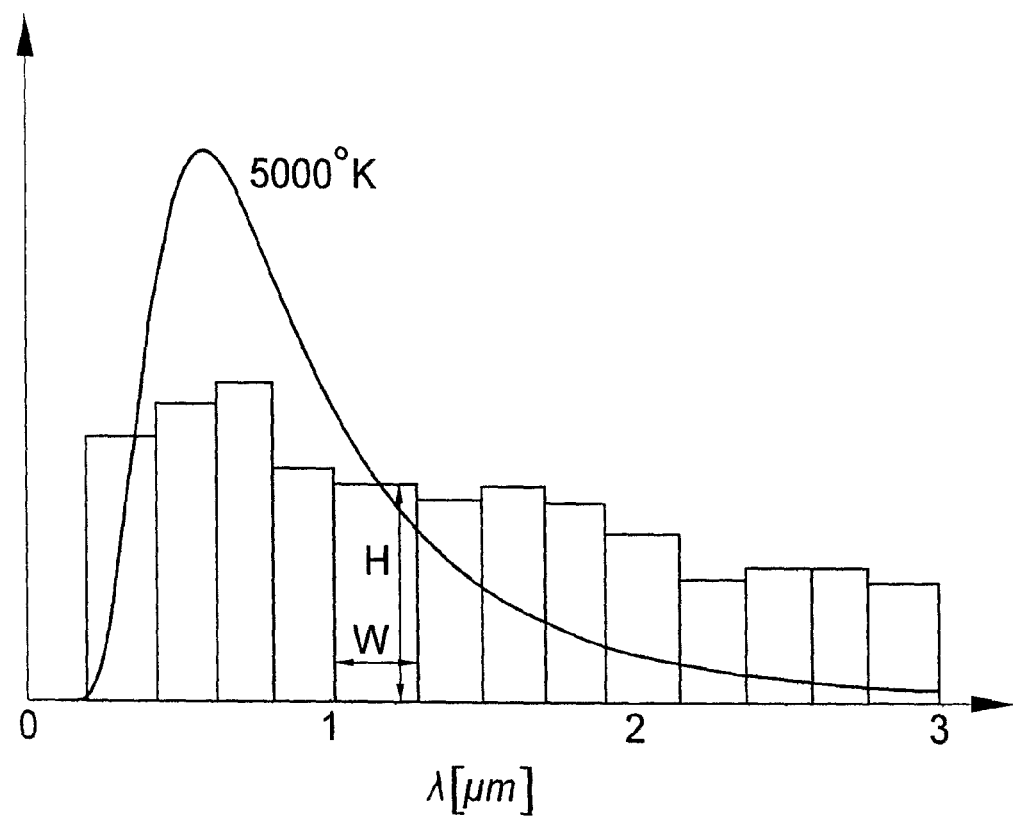
FIG. 2 is a simplified graphical representation of a solar electromagnetic spectrum, showing power density as a function of wavelength, and on which are shown illustrative absorption bands and illustrative absorption efficiencies for excitable gases.

Referring now to the drawings, FIG. 2 provides a simplified graphical representation of a solar electromagnetic spectrum, showing power density as a function of wavelength. FIG. 2 further provides illustrative absorption bands and illustrative absorption efficiencies for electron-excitable media such as electron-excitable gases. Each such gas has a characteristic absorption band of width W. Within the absorption band of a gas, energy from an energy source may be absorbed by the gas, such that bound electrons are promoted into an excited or elevated state. The absorption efficiencies between the lower and higher energy-states may also vary from gas to gas, as represented by the variation in the height H of the respective absorption bands shown in FIG. 2.

It must be emphasized that the absorption band of a gas may widen appreciably with increasing partial pressure of the gas.

Figure 3:
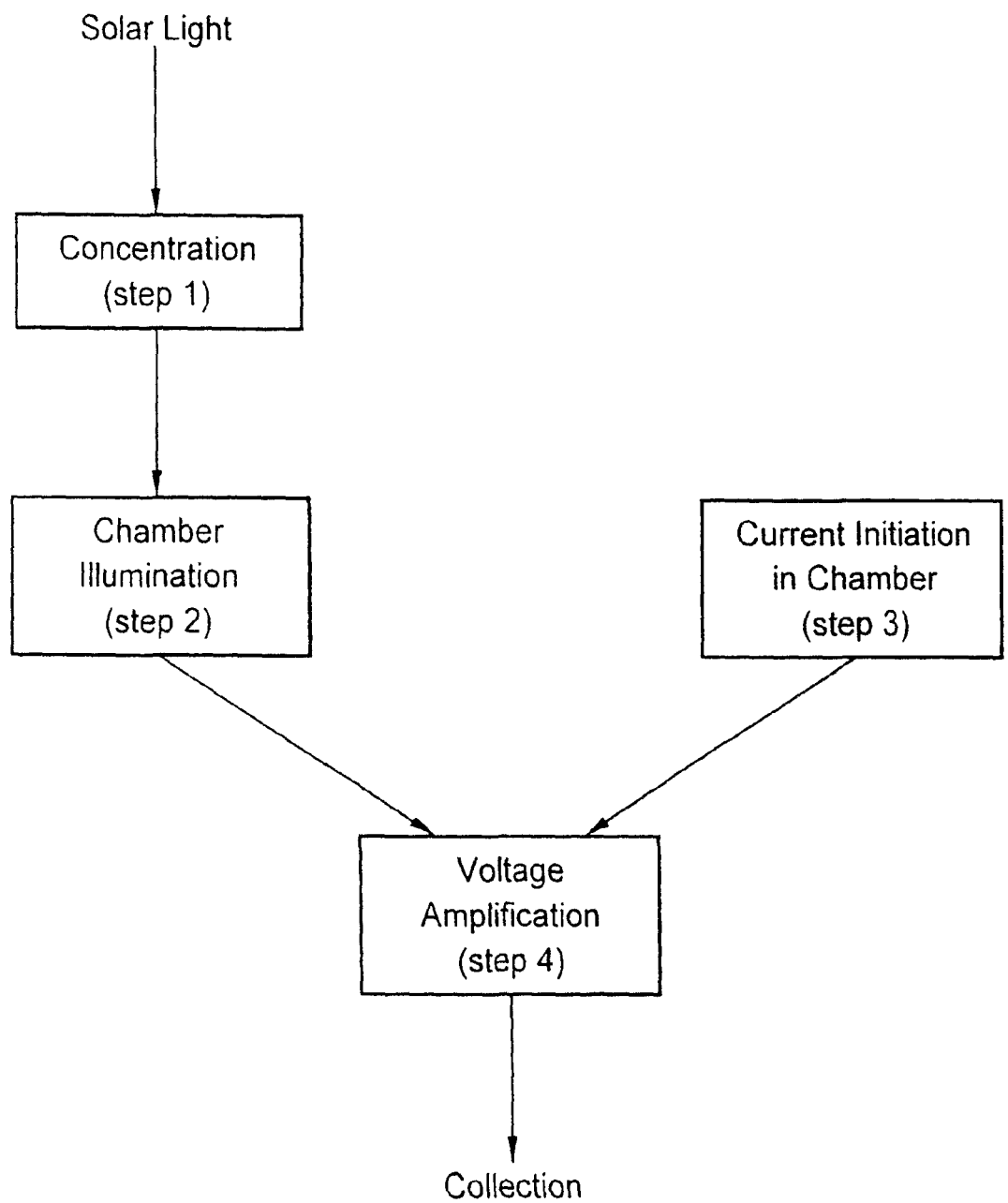
FIG. 3 is a block diagram of one embodiment of the solar energy conversion method, in which solar energy is utilized in voltage amplification of an input voltage signal.

FIG. 3 is a block diagram of one embodiment of the solar energy conversion method, in which solar energy is utilized in voltage amplification of an initiated current. In a preferred operation, solar light is directed through a concentrator (step 1), typically transparent or substantially transparent, to produce concentrated light. In step 2, solar light, adapted solar light, or concentrated solar light is directed into a typically transparent or substantially transparent chamber containing at least one excitable medium.

While this medium could include at least one solid-state medium, or at least one liquid medium, having bound electrons that may promoted into an excited state, the following description relates in exemplary fashion to a medium containing at least one gas, and more typically, a plurality of gases.

At least a portion of the light entering the chamber is absorbed by the plurality of gases, whereby bound electrons are promoted into an excited, higher state, to effect illumination of the chamber.

The gas within the chamber also forms part of an electric circuit having a power supply. As will be explained in greater detail hereinbelow, leads from the circuit connect to at least two electrodes, which extend through the wall of chamber in at least two places, to fluidly communicate with the chamber gases. In step 3, the power supply is activated, producing a voltage sufficient to initiate a flow of electrons through the chamber gases, between the electrodes.

With this flow of electrons through the chamber gases established, the excited, bound electrons in the chamber gases interact with the electrons passing through the medium, and transfer energy thereto thereby amplifying the voltage signal (step 4). The energy produced in this manner (from the absorption of the solar light) is then collected from the electric circuit.

Figure 4:
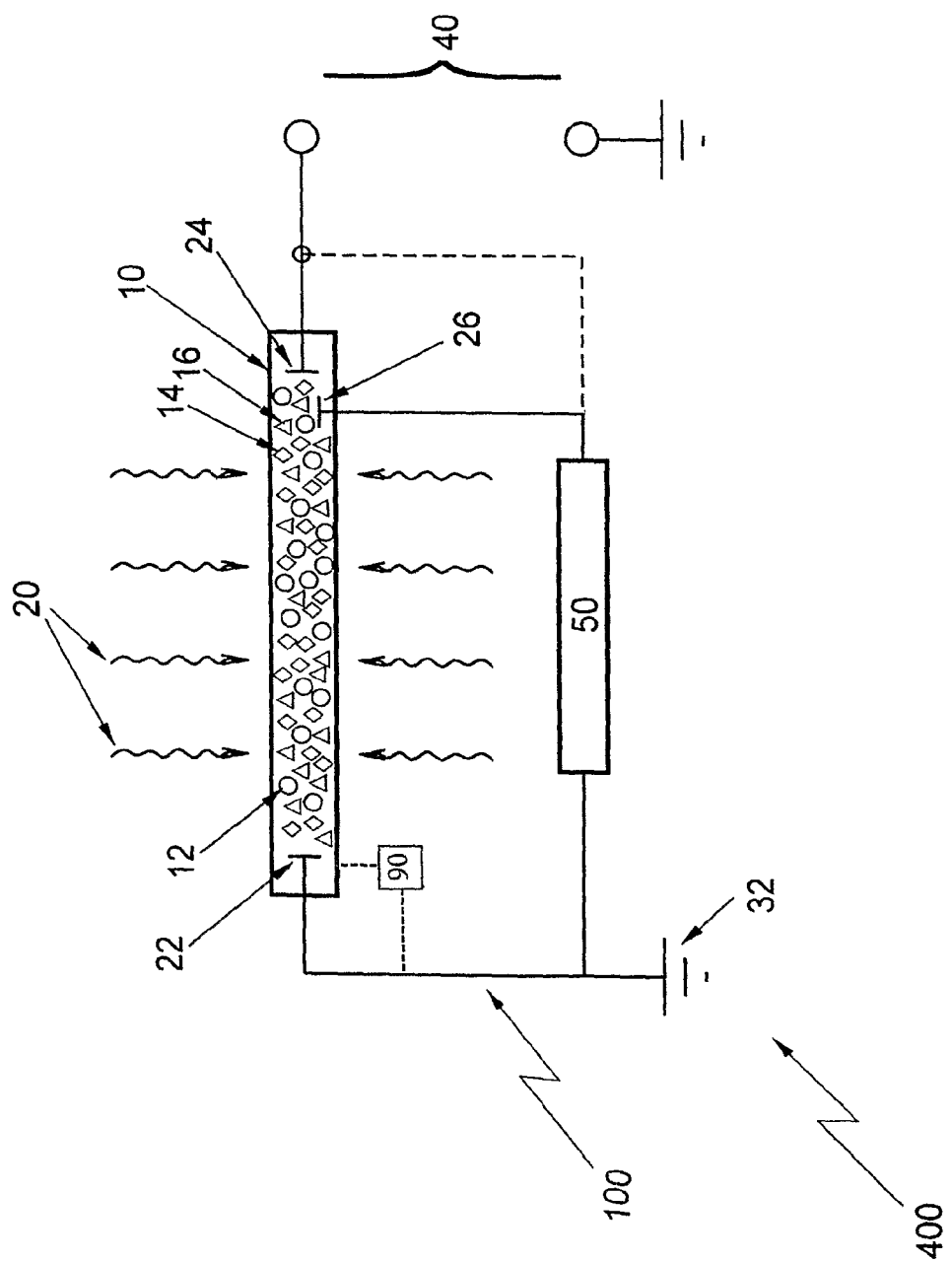
FIG. 4 is a schematic representation of one exemplary embodiment of the solar energy conversion apparatus of the present invention.

FIG. 4 is a schematic representation of one exemplary embodiment of a solar energy conversion apparatus 400 of the present invention, which may employ the above-described method. Solar light 20, including adapted solar light or concentrated solar light, is directed into a transparent or substantially transparent chamber such as cylindrical chamber 10 containing at least one excitable medium, such as a first excitable gas 12, a second excitable gas 14, and at least a third excitable gas 16. Chamber 10 also contains, or is associated with, at least one electrode 22 at or near a first location, first side, or first end of chamber 10, and at least one electrode 24 at a second location, second side, or second end of chamber 10. Thus, electrodes 22 and 24 are disposed in a spaced apart fashion, whereby excitable gases 12, 14, and 16 are at least partially disposed between, and fluidly communicate with, electrodes 22 and 24. Electrodes 22, 24 may be any of various commercially available electrodes, e.g., electrodes used in standard neon lighting arrangements.

Electrodes 22 and 24 are connected to an electric circuit 100 such that the excitable medium completes circuit 100. Circuit 100 may be connected to a ground 32. Circuit 100 may have an input or power source such as current source 50, which may have, or be associated with, an initiating mechanism such as initiator 90 adapted and disposed to produce a voltage sufficient to initiate a flow of electrons through excitable gases 12, 14, and 16, between electrodes 22 and 24. Current source 50 may be further adapted to maintain a first voltage signal through chamber 10.

The first voltage signal may be at least 1.2 Volts, at least 2 Volts, at least 5 Volts, or at least 10 Volts. Typically, the first voltage signal may be less than 1000 Volts; more typically, the first voltage signal may be between 10 Volts and 1000 Volts.

In the method and device of the present invention, after the initial voltage is applied, the number of charge carriers, or free electrons, within the device, may remain substantially constant as voltage amplification occurs.

Initiator 90 is preferably disposed in proximity to chamber 10, and may initiate the flow of electrons by induction. Initiator 90 may be AC, producing a short, high-voltage pulse, much like the starter of a standard fluorescent lamp. Alternatively, initiator 90 may be DC, operating much like the internal field of a photovoltaic diode. Initiator 90 may be disposed adjacent to or contacting chamber 10, external or internal to chamber 10. If disposed within chamber 10, initiator 90 may be electrically insulated from the gas and from the flow of electrons.

The energy produced in this manner (gained by free electrons from bound electrons, which, in turn, were energized by the absorption of solar light) is collected by electrode 24 and is manifested as voltage at output 40.

It must be emphasized that the higher energy state of the electrons in the excitable medium refers to a discrete, bound state. In a plasma, by sharp contrast, the high-energy electrons are unbound to the atom, to the point that a plasma is considered to be an ionized medium, in which the atom/molecule is positively charged.

Optionally, at least one additional electrode, such as electrode 26, may be disposed within chamber 10, so as to contact excitable gases 12, 14, and 16. In this case, electrode 26 may be electrically connected to circuit 100 and current source 50, while electrode 24 may be utilized solely for withdrawing energy to output 40.

Figure 5:
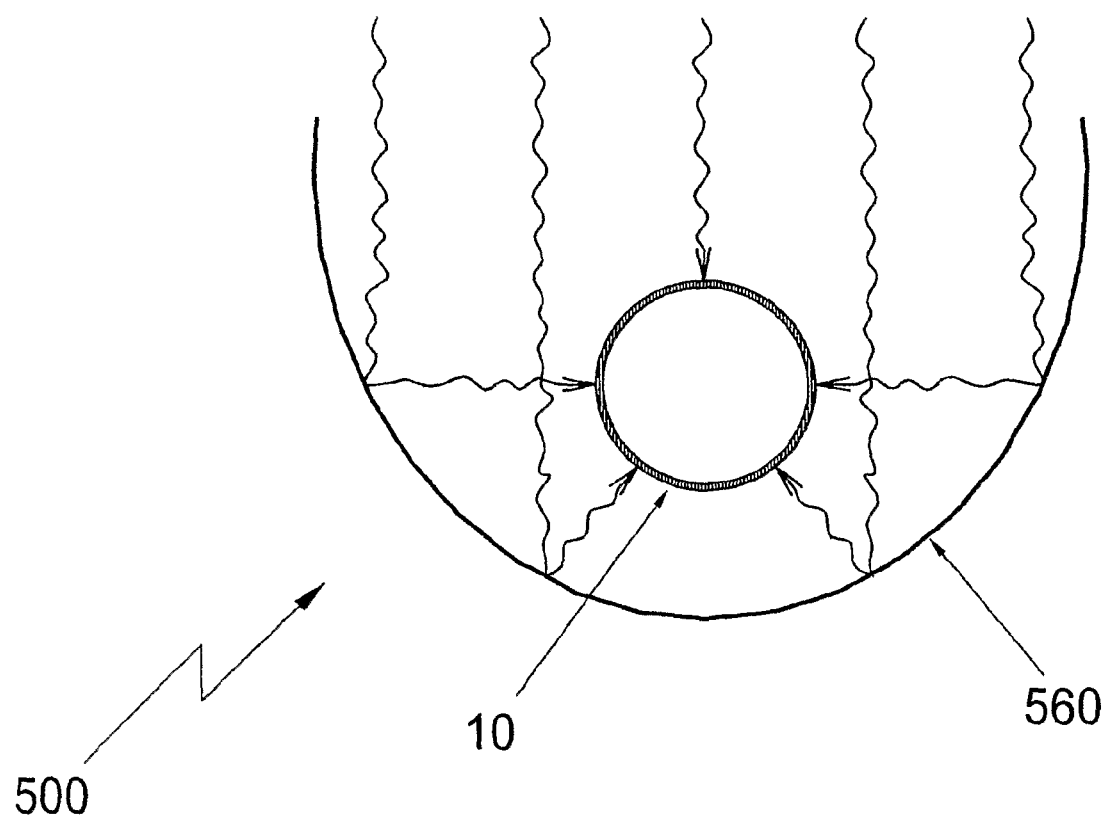
FIG. 5 is a schematic end view of one exemplary embodiment of the solar energy conversion apparatus of the present invention, the apparatus including a parabolic concentrator.

FIG. 5 is a schematic end view of one exemplary embodiment of the solar energy conversion apparatus of the present invention, in which an apparatus 500 includes a concentrator or optical concentrator such as parabolic concentrator 560. Transparent cylindrical chamber 10 is disposed within parabolic concentrator 560, preferably at or near a focal point thereof, such that light entering concentrator 560 may be deflected by the inner surface of concentrator 560, towards cylindrical chamber 10.

Concentrator 560 may have an optical surface area that greatly exceeds the optical surface area of chamber 10. A ratio of the optical surface area of concentrator 560 to the optical surface area of chamber 10 may preferably be at least 2 to 1, more preferably, at least 5 to 1, yet more preferably, at least 50 to 1, and most preferably, at least 500 to 1. When chamber 10 receives concentrated light from concentrator 560, the temperature of the excitable medium within the chamber may be above 325K, above 400K, above 500K, or even considerably higher. Typically, the operating temperature of the excitable medium within the chamber may be below 1000K, below 700K, or below 550K. When the excitable medium includes, consists primarily of, or consists essentially or substantially of one or more excitable gases, the device may be adapted whereby the operating temperature is maintained below, preferably at least 100K below the temperature at which any of the excitable gases may be converted into a plasma (more than 5% on a statistical basis).

The excitable gases are selected, and adapted within chamber 10, to absorb at least 5% of an energy flux within a wavelength range of 0.2 micrometers to 3 micrometers, emitted by a black body operating at 5500K (the temperature at the surface of the sun is approximately 5500K), by elevating the bound electrons to a higher energy state. This corresponds to 5% of the area under the power density curve for black body emissions at 5500K, within that wavelength range.

Preferably, the excitable medium gases are selected, and adapted within the chamber to absorb at least 10%, preferably at least 25%, more preferably at least 45%, yet more preferably at least 60%, and most preferably at least 70%, of the energy flux, such that the efficiency of the device is increased.

To this end, chamber 10 may be filled with a plurality or large plurality of gases having different absorption bands. However, the increased efficiency may be offset, to some degree, by the increased cost and complexity associated with the use of such a large plurality of gases. Some wavelength ranges may be covered solely by exotic or expensive gases, or gases that may decompose, or react with other gases in chamber 10. Some gases pose health and safety risks, particularly at elevated temperatures and pressures. The use of some gases may be corrosive or otherwise detrimental to the function of the electrodes, or other components within the chamber.

One manner of adapting the gases is by operating at a superatmospheric pressure. Since, as mentioned hereinabove, the absorption band of a gas may widen appreciably with increasing partial pressure of the gas, it may be highly advantageous to operate chamber 10 at a pressure above 1.2 ATA, above 2 ATA, above 4 ATA, or even above 8 ATA, e.g., within a range of 10-30 ATA. Various glass chambers used in laser applications may have operating pressures in the range of 10-30 ATA. The technology behind such existing units might readily be adapted for use in conjunction with the device and method of the present invention.

In selecting gases for use within chamber 10, it is preferable that the mean transition time of the bound electrons from the higher energy state to the lower energy state is at least 1 nanosecond, and in many cases, at least 5 nanoseconds or at least 1 microsecond. A longer transition time improves the probability that the energy released by the change in energy state of the bound electron will be absorbed by a free electron passing by, and not released to the environment.

A longitudinal magnetic field (i.e., longitudinal to the flow of free electrons between the electrodes) may be established within the interaction region of chamber 10. While a transverse magnetic field may also be produced, substantially orthogonal to the longitudinal field, the magnitude of the longitudinal field may be much larger than that of the transverse field, typically by a ratio of at least 5:1, or at least 10:1, and more typically, by a ratio of at least 20:1, or at least 50:1.

As used herein in the specification and in the claims section that follows, the term "solar light", and the like, is specifically meant to include concentrated solar light, and adapted solar light such as wavelength adapted solar light.

As used herein in the specification and in the claims section that follows, the terms "discrete high energy state", "discretely higher energy state", and the like, refer specifically to an energy state of bound electrons, and is specifically meant to exclude an energy state within a continuum of possible high energy states, such as plasma structures, in which high-energy electrons are unbound by the atom and belong to such the continuum of possible high energy states.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications mentioned in this specification are herein incorporated in their entirety by reference into the specification, to the same extent as if each individual publication, was specifically and individually indicated to be incorporated herein by reference. In addition, citation or identification of any reference in this application shall not be construed as an admission that such reference is available as prior art to the present invention.

What is claimed is:

1. A device for producing electricity by harnessing sunlight to produce an amplified voltage signal, with respect to a first voltage signal, the device comprising:
   (a) a sealed chamber, at least partially defined by an at least partially transparent housing;
   (b) at least one excitable medium, disposed within said chamber, in which, when said medium is exposed to solar light having wavelengths in a range of 0.2 micrometers to 3 micrometers, bound electrons in said excitable medium are elevated to at least one discretely higher energy state;
   (c) at least two electrodes, disposed in a spaced apart fashion, and disposed with respect to a wall of said chamber whereby at least a portion of said medium is between, and communicating with, said electrodes;
   (d) an electric circuit, said portion of said medium and said electrodes completing said circuit;
   (e) an initiating mechanism, initiating an initial voltage signal through said chamber, between said electrodes, and
   (f) a power source, associated with said circuit, and adapted to maintain the first voltage signal through said chamber, between said electrodes, such that said bound electrons in said higher energy state transfer energy to free electrons traversing the first voltage signal to produce the amplified voltage signal,
and wherein said excitable medium is selected to absorb at least 5% of an energy flux within a wavelength range of 0.2 micrometers to 3 micrometers, emitted by a black body operating at 5500K, by elevating said bound electrons to said discretely higher energy state;
the device fulfilling at least one of the following structural conditions:
said excitable medium within said sealed chamber includes a mixture of excitable gases;
   said excitable medium within said sealed chamber includes at least one excitable gas disposed under a superatmospheric pressure.

2. The device of claim 1, further comprising an optical concentrator, optically disposed between a solar light source and said chamber, said concentrator adapted to concentrate light from said solar light source.

3. The device of claim 1, said sealed chamber having a superatmospheric pressure above 1.2 atmospheres absolute (ATA).

4. The device of claim 1, said sealed chamber having a superatmospheric pressure above 4 atmospheres absolute (ATA).

5. The device of claim 1, wherein said at least partially transparent housing includes a solid wall, said wall including a material selected from the group consisting of a glass and a substantially transparent ceramic material.

6. The device of claim 1, said excitable medium including a mixture of excitable gases, said excitable gases selected from the group of gases consisting of neon, argon, xenon, and sulfur hexafluoride, and having a partial vapor fraction of at least 0.02, within said chamber.

7. The device of claim 1, said excitable gases including less than 0.01, by partial vapor fraction, water vapor.

8. The device of claim 1, said excitable gases including less than 0.01, by partial vapor fraction, mercury vapor.

9. The device of claim 1, said excitable gases including less than 0.01, by partial vapor fraction, oxygen.

10. The device of claim 1, wherein said excitable gases are selected to absorb at least 10% of said energy flux, by elevating said bound electrons to said higher energy state.

11. The device of claim 1, wherein a mean transition time of said bound electrons from said higher energy state to a lower energy state is at least 5 nanoseconds.

12. The device of claim 1, said initiating mechanism and said power source adapted, and said excitable medium selected and adapted within said sealed chamber, such that a ratio of a voltage of the amplified signal to said first signal is at least 1.01.

13. The device of claim 1, said excitable gas medium including said mixture of excitable gases, and said sealed chamber having a superatmospheric pressure above 1.2 atmospheres absolute (ATA).

14. The device of claim 13, said excitable gases selected from the group of gases consisting of neon, argon, xenon, and sulfur hexafluoride, and having a partial vapor fraction of at least 0.02, within said chamber.

15. A device for producing solar electricity by harnessing sunlight to produce an amplified voltage signal, with respect to a first voltage signal, the device comprising:
   (a) a sealed chamber, at least partially defined by an at least partially transparent housing;
   (b) at least one excitable gas, disposed within said chamber, in which, when said gas is exposed to solar light having wavelengths in a range of 0.2 micrometers to 3 micrometers, bound electrons in said excitable gas are elevated to at least one discretely higher energy state;
   (c) at least two electrodes, disposed in a spaced apart fashion, and disposed with respect to a wall of said chamber whereby at least a portion of said gas is between, and communicating with, said electrodes;
   (d) an electric circuit, said portion of said gas and said electrodes completing said circuit;
   (e) an initiating mechanism, initiating an initial voltage signal through said chamber, between said electrodes, and
   (f) a power source, associated with said circuit, and adapted to maintain the first voltage signal through said chamber, between said electrodes,
said bound electrons in said higher energy state transferring energy to free electrons flowing in the first voltage signal to produce the amplified voltage signal, said sealed chamber having a superatmospheric pressure.

16. The device of claim 15, wherein said superatmospheric pressure is above 1.2 atmospheres absolute (ATA).

17. A method of producing solar electricity by harnessing solar light to produce an amplified voltage signal, the method comprising:
   (a) providing the device of claim 1;
   (b) exposing said excitable medium to the solar light;
   (c) producing said first voltage signal by means of said mechanism, and (d) amplifying said first voltage signal by said transfer of said energy of said electrons to said free electrons, to produce the amplified voltage signal.

18. The device of claim 16, wherein a mean transition time of said bound electrons from said higher energy state to a lower energy state is at least 5 nanoseconds.

19. The method of claim 17, wherein a ratio of a voltage of the amplified signal to said first signal is at least 1.01.

20. The method of claim 17, wherein said first signal has a voltage in a range of 1 Volt to 500 Volts.

* * * * *